(12) United States Patent
Cadloni et al.

(10) Patent No.: US 10,936,246 B2
(45) Date of Patent: Mar. 2, 2021

(54) DYNAMIC BACKGROUND SCAN OPTIMIZATION IN A MEMORY SUB-SYSTEM

(71) Applicant: Micron Technology, Inc., Boise, ID (US)

(72) Inventors: Gerald L. Cadloni, Longmont, CO (US); Michael Sheperek, Longmont, CO (US); Francis Chew, Boulder, CO (US); Bruce A. Liikanen, Berthoud, CO (US); Larry J. Koudele, Erie, CO (US)

(73) Assignee: Micron Technology, Inc., Boise, ID (US)

(*) Notice: Subject to any disclaimer, the term of this patent is extended or adjusted under 35 U.S.C. 154(b) by 105 days.

(21) Appl. No.: 16/156,904

(22) Filed: Oct. 10, 2018

(65) Prior Publication Data

US 2020/0117387 A1  Apr. 16, 2020

(51) Int. Cl.
*G06F 12/00* (2006.01)
*G06F 13/00* (2006.01)
(Continued)

(52) U.S. Cl.
CPC .......... *G06F 3/0659* (2013.01); *G06F 3/0604* (2013.01); *G06F 3/0619* (2013.01);
(Continued)

(58) Field of Classification Search
CPC ... G06F 3/0604; G06F 3/0614; G06F 12/0238
(Continued)

(56) References Cited

U.S. PATENT DOCUMENTS 9,092,350 B1 7/2015 Jeon et al.
9,153,336 B1 10/2015 Yang et al.
(Continued)

FOREIGN PATENT DOCUMENTS

GB  2383455 A  6/2003

OTHER PUBLICATIONS

International Application No. PCT/US2018/033873—International Search Report & Written Opinion, dated Sep. 7, 2018, 9 pages.
(Continued)

*Primary Examiner* — Edward J Dudek, Jr.
*Assistant Examiner* — Sidney Li
(74) *Attorney, Agent, or Firm* — Perkins Coie LLP

(57) ABSTRACT

Aspects of the present disclosure are directed to performing varying frequency memory sub-system background scans using either or both a timer and an I/O event limit. This can be accomplished by identifying a background scan trigger event from one of multiple possible types of background scan trigger events, such as a timer expiration or reaching an event count limit. In response to the background scan trigger event, a background scan can be initiated on a memory portion. The background scan can produce results, such as CDF-based data. When a metric based on the results exceeds a background scan limit, a refresh relocation can be performed and logged. A metric can be generated based on the CDF-based data, obtained error recovery depth data, or refresh relocation event data. When the metric is above or below corresponding background scan thresholds, a background scan frequency can be adjusted.

19 Claims, 10 Drawing Sheets

(51) Int. Cl.
*G06F 13/28* (2006.01)
*G06F 3/06* (2006.01)
*G06F 11/10* (2006.01)
*G11C 29/52* (2006.01)
*G06F 13/42* (2006.01)
*G06F 13/16* (2006.01)
*G06F 12/02* (2006.01)

(52) U.S. Cl.
CPC ........ *G06F 3/0679* (2013.01); *G06F 11/1068* (2013.01); *G06F 13/1668* (2013.01); *G06F 13/4282* (2013.01); *G11C 29/52* (2013.01); *G06F 3/0614* (2013.01); *G06F 12/0238* (2013.01); *G06F 2213/0008* (2013.01); *G06F 2213/0026* (2013.01); *G06F 2213/0028* (2013.01); *G06F 2213/0036* (2013.01); *G06F 2213/0042* (2013.01)

(58) Field of Classification Search
USPC ........................................................ 711/103
See application file for complete search history.

(56) References Cited

U.S. PATENT DOCUMENTS

| | | | |
|---|---|---|---|
| 9,355,735 B1 | 5/2016 | Chen et al. | |
| 9,454,420 B1 | 9/2016 | Tai et al. | |
| 9,558,850 B1 | 1/2017 | Bialas et al. | |
| 9,761,308 B1 | 9/2017 | Cometti | |
| 10,140,040 B1 | 11/2018 | Koudele et al. | |
| 10,170,195 B1 | 1/2019 | Ioannou et al. | |
| 10,379,739 B1 | 8/2019 | Bazarsky et al. | |
| 10,388,376 B2 | 8/2019 | Molas et al. | |
| 2002/0152459 A1* | 10/2002 | Bates | H04H 60/40 725/9 |
| 2005/0201148 A1 | 9/2005 | Chen et al. | |
| 2006/0277429 A1* | 12/2006 | Dasari | G06F 11/0709 714/4.11 |
| 2007/0025167 A1 | 2/2007 | Ziegelmayer et al. | |
| 2009/0055680 A1 | 2/2009 | Honda et al. | |
| 2010/0073069 A1 | 3/2010 | Wang et al. | |
| 2010/0097857 A1 | 4/2010 | Cernea | |
| 2010/0188919 A1 | 7/2010 | Fox et al. | |
| 2011/0167307 A1 | 7/2011 | Mori | |
| 2011/0305090 A1 | 12/2011 | Roohparvar et al. | |
| 2012/0030531 A1 | 2/2012 | Brewerton et al. | |
| 2012/0213001 A1 | 8/2012 | Yang | |
| 2012/0236653 A1 | 9/2012 | Spessot et al. | |
| 2012/0254699 A1 | 10/2012 | Ruby et al. | |
| 2013/0007543 A1 | 1/2013 | Goss et al. | |
| 2013/0024743 A1 | 1/2013 | Sharon et al. | |
| 2013/0117604 A1 | 5/2013 | Ha | |
| 2013/0132652 A1 | 5/2013 | Wood et al. | |
| 2013/0227200 A1 | 8/2013 | Cometti et al. | |
| 2013/0346805 A1* | 12/2013 | Sprouse | G11C 16/3431 714/42 |
| 2014/0136928 A1 | 5/2014 | Mu et al. | |
| 2014/0157065 A1 | 6/2014 | Ong | |
| 2014/0281661 A1 | 9/2014 | Milton et al. | |
| 2014/0281767 A1 | 9/2014 | Alhussien et al. | |
| 2015/0036432 A1 | 2/2015 | Huang | |
| 2015/0085573 A1 | 3/2015 | Sharon et al. | |
| 2015/0154064 A1 | 6/2015 | Ghaly et al. | |
| 2015/0309858 A1 | 10/2015 | Weilemann et al. | |
| 2016/0041891 A1 | 2/2016 | Malshe et al. | |
| 2016/0092496 A1* | 3/2016 | Dietterich | G06F 12/0269 707/692 |
| 2016/0117216 A1 | 4/2016 | Muchherla et al. | |
| 2016/0132256 A1 | 5/2016 | Jung | |
| 2016/0133334 A1 | 5/2016 | Zhang et al. | |
| 2016/0147582 A1 | 5/2016 | Karakulak et al. | |
| 2016/0148701 A1 | 5/2016 | Karakulak et al. | |
| 2016/0148702 A1 | 5/2016 | Karakulak et al. | |
| 2016/0148708 A1 | 5/2016 | Tuers et al. | |
| 2016/0162185 A1 | 6/2016 | D'Abreu et al. | |
| 2016/0179406 A1* | 6/2016 | Gorobets | G11C 29/70 711/103 |
| 2016/0218740 A1 | 7/2016 | Parthasarathy et al. | |
| 2016/0259693 A1 | 9/2016 | Sundararaman et al. | |
| 2016/0266792 A1* | 9/2016 | Amaki | G06F 12/0246 |
| 2017/0053714 A1 | 2/2017 | Guy et al. | |
| 2017/0091039 A1 | 3/2017 | Hong | |
| 2017/0097868 A1 | 4/2017 | Kim et al. | |
| 2017/0148510 A1 | 5/2017 | Bazarsky et al. | |
| 2017/0263311 A1 | 9/2017 | Cometti | |
| 2017/0269991 A1 | 9/2017 | Bazarsky et al. | |
| 2017/0271031 A1 | 9/2017 | Sharon et al. | |
| 2018/0189125 A1 | 7/2018 | Karlik et al. | |
| 2018/0277228 A1 | 9/2018 | Takada et al. | |
| 2018/0341416 A1 | 11/2018 | Koudele et al. | |
| 2018/0341552 A1 | 11/2018 | Liikanen et al. | |
| 2018/0341553 A1 | 11/2018 | Koudele et al. | |
| 2019/0103164 A1 | 4/2019 | Malshe et al. | |
| 2019/0147964 A1 | 5/2019 | Yun et al. | |
| 2019/0164599 A1 | 5/2019 | Avraham et al. | |
| 2019/0171381 A1 | 6/2019 | Ioannou et al. | |
| 2019/0172542 A1 | 6/2019 | Miladinovic | |
| 2019/0278653 A1 | 9/2019 | Padilla et al. | |
| 2019/0354313 A1 | 11/2019 | Sheperek et al. | |

OTHER PUBLICATIONS

International Application No. PCT/US2018/033877—International Search Report & Written Opinion, dated Sep. 14, 2018, 22 pages.
International Application No. PCT/US2018/033881—International Search Report & Written Opinion, dated Sep. 14, 2018, 12 pages.
International Application No. PCT/US2019/033179—International Search Report and Written Opinion, dated Sep. 18, 2019, 12 pages.
TW Patent Application No. 107117756—Taiwanese Office Action and Search Report, dated Jan. 31, 2019, 19 pages.
TW Patent Application No. 107117756—Taiwanese Search Report, dated Jul. 22, 2019, with English Translation, 2 pages.
TW Patent Application No. 107117813—Taiwanese Office Action and Search Report, dated Mar. 18, 2019, 17 pages.

* cited by examiner

| ERS | CE0 | CE1 | CE2 | CE3 | sum |
|---|---|---|---|---|---|
| 0 | 193 | 194 | 197 | 187 | 771 |
| 1 | 45 | 41 | 39 | 50 | 175 |
| 2 | 0 | 0 | 0 | 0 | 0 |
| 3 | 2 | 2 | 0 | 1 | 5 |
| 4 | 0 | 0 | 0 | 0 | 0 |
| 5 | 0 | 1 | 0 | 0 | 1 |
| 6 | 0 | 0 | 0 | 0 | 0 |
| 7 | 0 | 0 | 0 | 0 | 0 |
| 8 | 0 | 0 | 0 | 0 | 0 |
| 9 | 0 | 0 | 0 | 0 | 0 |
| 10 | 0 | 0 | 0 | 0 | 0 |
| 11 | 0 | 0 | 0 | 0 | 0 |
| 12 | 0 | 0 | 0 | 0 | 0 |
| 13 | 0 | 0 | 0 | 0 | 0 |
| 14 | 0 | 0 | 0 | 0 | 0 |
| 15 | 0 | 0 | 0 | 0 | 0 |
| sum | 238 | 238 | 238 | 238 | 952 |

*FIG. 6A*

| ERS | CE4 | CE5 | CE6 | CE7 | sum |
|---|---|---|---|---|---|
| 0 | 203 | 182 | 184 | 151 | 720 |
| 1 | 5 | 8 | 4 | 11 | 28 |
| 2 | 9 | 14 | 17 | 23 | 63 |
| 3 | 1 | 12 | 13 | 17 | 43 |
| 4 | 7 | 10 | 4 | 18 | 39 |
| 5 | 2 | 2 | 6 | 5 | 15 |
| 6 | 1 | 1 | 0 | 3 | 5 |
| 7 | 0 | 0 | 0 | 1 | 1 |
| 8 | 0 | 0 | 0 | 0 | 0 |
| 9 | 1 | 0 | 0 | 0 | 1 |
| 10 | 0 | 0 | 0 | 0 | 0 |
| 11 | 0 | 0 | 0 | 0 | 0 |
| 12 | 0 | 0 | 1 | 0 | 1 |
| 13 | 0 | 0 | 0 | 0 | 0 |
| 14 | 0 | 0 | 0 | 0 | 0 |
| 15 | 0 | 0 | 0 | 0 | 0 |
| sum | 229 | 229 | 229 | 229 | 916 |

*FIG. 6B*

DYNAMIC BACKGROUND SCAN OPTIMIZATION IN A MEMORY SUB-SYSTEM

TECHNICAL FIELD

The present disclosure generally relates to a memory sub-system, and more specifically, relates to improving background scanning in the memory sub-system.

BACKGROUND

A memory sub-system can be a storage system, such as a solid-state drive (SSD), and can include one or more memory components that store data. The memory components can be, for example, non-volatile memory components and/or volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIGS. 6A and 6B are conceptual diagrams of example error recover stage depth data.

DETAILED DESCRIPTION

Figure 1:
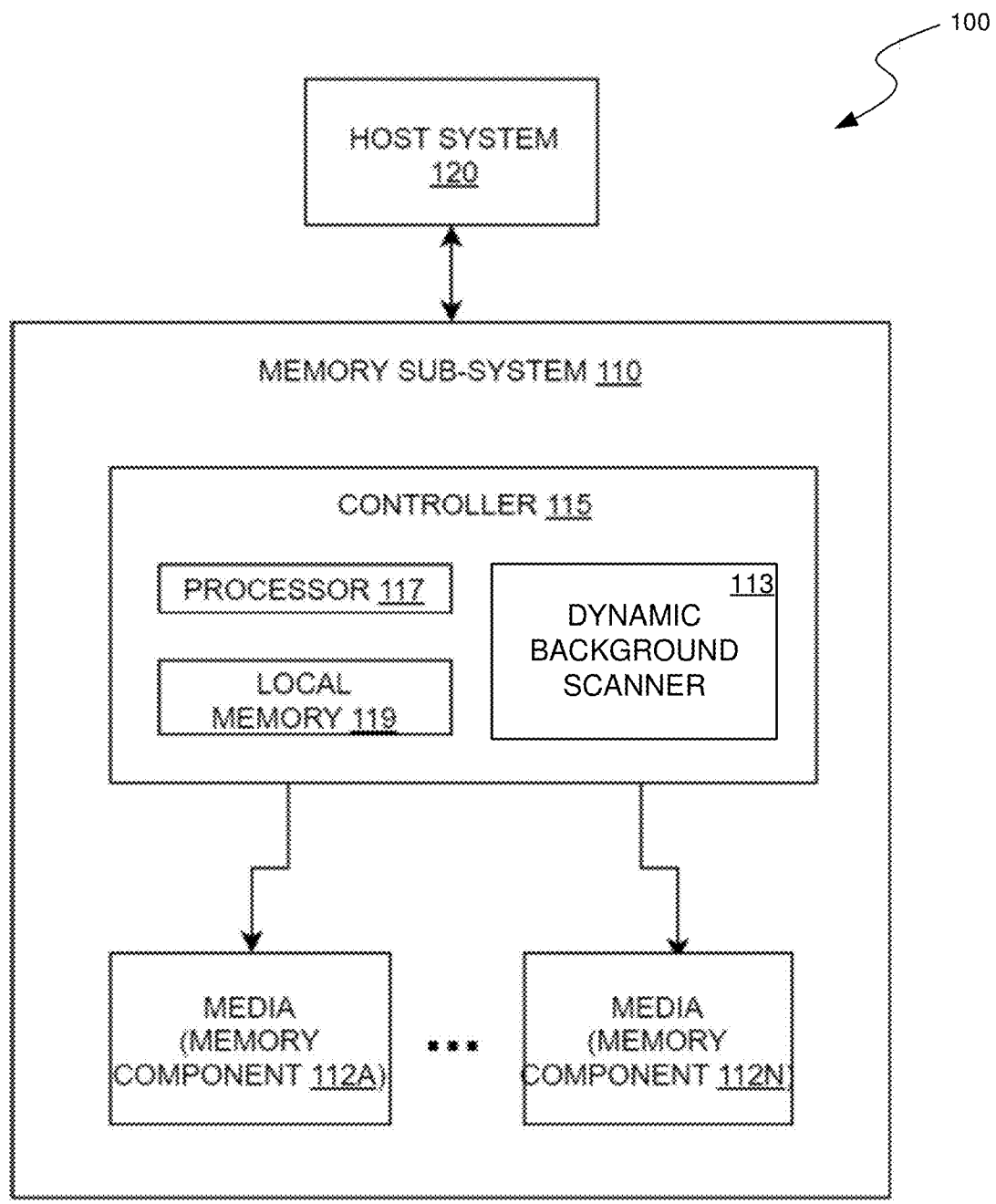
FIG. 1 illustrates an example computing environment that includes a memory sub-system in accordance with some embodiments of the present disclosure.

Aspects of the present disclosure are directed to performing varying frequency memory sub-system background scans using either or both a timer and an I/O event limit. A memory sub-system is also hereinafter referred to as a "memory device." An example of a memory sub-system is a storage system, such as a solid-state drive (SSD). In some embodiments, the memory sub-system is a hybrid memory/storage sub-system. In various implementations, memory devices can include non-volatile memory devices, such as, for example, negative-and (NAND). In general, a host system can utilize a memory sub-system that includes one or more memory components. The host system can provide data to be stored at the memory sub-system and can request data to be retrieved from the memory sub-system.

A background scan operation can run in the background of a memory system and/or device (e.g., during idle periods in which the memory system and/or device is not performing other operations in response to a host-initiated command). In some embodiments, a background scan operation can be performed as a foreground operation (e.g., in response to a host-initiated command or according to a predetermined schedule). Memory device background scanning can begin by reading a section of memory, such as a codeword, a block, or a portion of a block. During a background scan, the section of memory is decoded by the error-correcting code (ECC) engine. The background scan can track the number of bit corrections needed by the ECC engine in order to determine the quality of that section of memory. The background scan can also determine whether sections are not correctable by the ECC engine. The section of memory can be analyzed to determine a metric, e.g. in terms of amount or type of error correction required, estimated remaining life, amount of cells functioning below a threshold level, the section not being correctable by the ECC engine, etc. If the metric is above a threshold, the background scan can proceed to a next memory section. If the metric is below the threshold, the background scan can attempt corrective measures, such as by performing a refresh relocation event on the memory section or a memory portion related to the memory section. For example, if a portion of a block is read and determined to have a metric below the threshold, a refresh relocation event can be performed for the block containing the read portion.

Conventionally, background scans occur at a particular frequency for the life of the memory device. In some conventional implementations, a controller for the memory system operates a timer and when the timer reaches a timing threshold (e.g. 3 minutes), a background scan is initiated. In other conventional implementations, the controller keeps an I/O event count, and when a limit (e.g. 2000 read or write operations) is reached a background scan is initiated. However, limiting the trigger for background scans to either a timer threshold or reaching an event count limit, but not both, restricts opportunities for beneficial background scans. In addition, triggering background scans based on static frequencies can either perform excess background scans when they are not needed or can limit background scanning despite additional background scanning likely being beneficial. For example, when a memory device is new or of particular high-quality, excess background scanning that is not needed to correct malfunctions can waste power resources and cause unnecessary delay. In addition, when a memory device is old or of lower reliability, insufficient background scanning can reduce relative performance and reliability of the memory device.

Some aspects of the present disclosure address the above and other deficiencies by triggering background scans in response to either a timer threshold or reaching an I/O event limit. This allows background scans to occur in additional circumstances with more nuanced parameters. Additional aspects of the present disclosure address the above and other deficiencies by dynamically configuring background scan parameters, such as the timer or I/O event limit, based on data gathered from background scans, other I/O operations, test procedures, etc. In some implementations, the data can be gathered on the same memory system in which the background scan parameters are to be configured. In other implementations, the data can be gathered on other systems and can be used to extrapolate generalized parameters for multiple systems, e.g. by defining different background scan frequencies for different stages in a memory device life cycle or in response to various identified memory device conditions.

In various and limitations, the gathered data can be histograms of error counts or other error data, relocation event statistics, or error recovery depth statistics. Adjusting the background scan parameters can include comparing an aspect of the data to a threshold corresponding to that type of data and, based on the comparing, determining whether to make the adjustment and by what magnitude. In some implementations, aspects of the data can be compared to different thresholds, one specifying whether to increase the background scan frequency and one specifying whether to decrease the background scan frequency.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a dynamic background scanner 113 that can be used to trigger background scanning based on both a timer and event counts and dynamically configure background scan triggers using result of statistical analysis. In some embodiments, the controller 115 includes at least a portion of the dynamic background scanner 113. For example, the controller 115 can include a processor 117 (processing device) configured to execute instructions stored in local memory 119 for performing the operations described herein. In some embodiments, the dynamic background scanner 113 is part of the host system 110, an application, or an operating system.

The dynamic background scanner 113 can track both a timer and I/O event tracking data (e.g. a counter) and, when either reaches a corresponding threshold, trigger a memory background scan. The dynamic background scanner 113 can also gather data, e.g. by obtaining statistics on a depth of error correction reached in various error correction procedures or by recording background scan or event data, such as a histogram of error counts or statistics on relocation events. Using this gathered data (or data gathered by other memory systems), dynamic background scanner 113 can update a frequency at which background scans occur. For example, the length of a trigger timer can be changed or an event count limit trigger can be changed. In some implementations, dynamic background scanner 113 can update the background scan frequency when a particular value from CDF-based data generated from the histogram reaches a corresponding threshold. In some implementations, dynamic background scanner 113 can update the background scan frequency when an error recovery depth threshold is reached. In some implementations, dynamic background scanner 113 can update the background scan frequency when a frequency of relocation events reaches a relocation threshold. Further details with regards to the operations of the dynamic background scanner 113 are described below.

Figure 2:
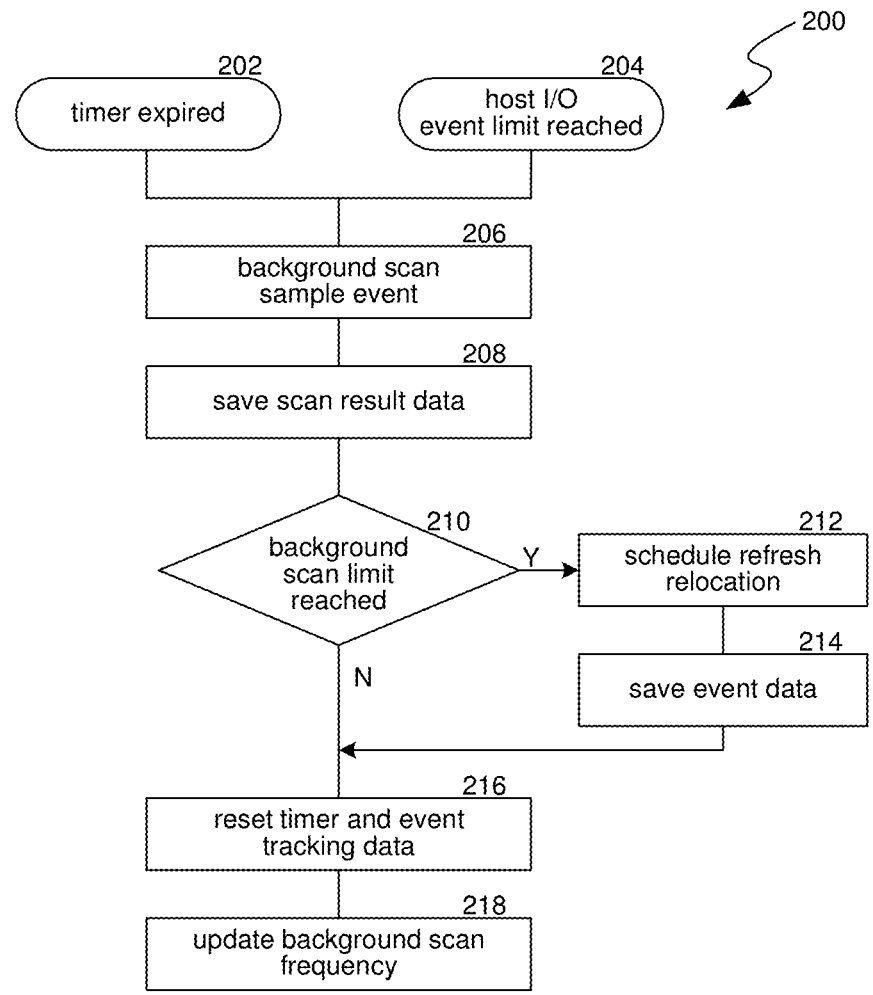
FIG. 2 is a flow diagram of an example method to perform background scans based on a timer or event limit and to update background frequency based on background scan or event data in accordance with some embodiments of the present disclosure.

FIG. 2 is a flow diagram of an example method 200 to perform background scans based on a timer or event limit and to update background frequency based on background scan or event data in accordance with some implementations of the present technology. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the dynamic background scanner 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The processing logic for method 200 can be triggered by a background scan trigger event from a set of background scan trigger events. For example, at block 202, a trigger event can occur in response to a timer reaching a timing threshold, or at block 204, a trigger event can occur in response to event tracking data (e.g. a count of I/O events) reaching an event limit threshold. A controller of a memory system can maintain the timer used in block 202 and can initiate the processing logic for method 200 at block 202 when the timer reaches a timing threshold. The controller can also keep tracking data for certain I/O events, such as read and write events, and can initiate the processing logic for method 200 at block 204 when the tracking data reaches a threshold. Additional details on maintaining the I/O event tracking data and triggering the processing logic for method 200 are provided below in relation to FIG. 3. Triggering the processing logic for method 200 by identifying a background scan trigger event from a set of background scan trigger events, either at block 202 or 204, can prevent the processing logic for method 200 from being further triggered by the alternate triggering mechanism, e.g. by blocking trigger listeners or resetting the timer and event counter.

At block 206, the processing logic can initiate a background scan. The background scan can include, for each of one or more memory blocks, reading a portion of the memory block, identifying whether a metric determined by performing the read is below a threshold, and if so, taking corrective measures on the memory block. In various implementations, determining the metric can include an amount of errors encountered, a level of error correction required to perform the read, an amount of cells in the portion of the block functioning below a threshold level, etc. When the metric is below the threshold, the background scan can attempt corrective measures such as performing a refresh or a refresh relocation event on the memory block, e.g. reading the entire block and either writing it back to the same or a different location.

Performing a background scan can generate various results which, at block 208, the processing logic can save. In some implementations, the results can be generated from procedures other than background scanning, such as based on errors encountered during normal memory system operation or during other tests e.g. during a block wear out test or usage test.

In some implementations, the results can be data useable to generate a cumulative distribution function (CDF) that specifies a frequency of memory units (e.g. codewords) having at least a given number of bits in error. The data useable to generate such a cumulative distribution function can be counts of errors per read memory unit during the background scan. This data can be transformed into a histogram for memory unit frequencies for given error counts, which in turn can be converted into the CDF-based data. In some implementations, the CDF-based data can be saved as one minus the CDF, on a logarithmic scale. Examples of CDF-based data resulting from a background scan are provided in FIGS. 5A and 5B.

In some implementations, the results can be frequencies at which various depths of error recovery are used to perform a memory unit read. A memory system can have multiple error recovery procedures (e.g. fifteen), each of which can be an escalation to be used when the previous error recovery procedure fails. The number of successive error recovery procedures required to perform a read operation is referred to as the error recovery depth. For example, if error recovery procedures one through four failed but error recovery procedure five was successful, this would be an error recover depth of five. In various implementations, error recovery statistics can be, for a given timeframe or a given set of read events, a number of memory die that reached each of the error recovery depths, an average error recovery depth reached, a count of die that reached at least one or more threshold recovery depths, the maximum recovery depth reached across die, etc.

At block 210, the processing logic can determine whether the background scan for a memory portion (e.g. block) that was just scanned indicates the memory portion requires corrective measures. The processing logic can make this determination by comparing background scan results with a background scan limit threshold. For example, the CDF-based data at a particular error probability rate can be used to determine a number of memory units (e.g. codewords) expected to have no more than the particular error probability rate. If this number is above a background scan limit threshold, the memory portion can be selected for corrective measures, causing the processing logic to proceed to block 212. Otherwise, the processing logic can proceed to block 216.

At block 212, the processing logic can schedule the memory portion for a corrective measure, such as a refresh relocation event or retiring the memory portion from use. At block 214, the processing logic can save event data from the corrective action, such as by updating a count of memory portions that have required corrective measures or storing a record of the corrective action with meta data such as a timestamp.

At block 216, the processing logic can reset a timer for triggering the processing logic at block 202 and can reset event tracking data for triggering the processing logic at block 204. In some implementations, the trigger blocking that occurred at block 202 or 204 can include resetting the timer and event count, in which case block 216 can be skipped.

At block 218, the processing logic can determine whether, and by how much, to update the background scan frequencies. Updating the background scan frequencies can include modifying the timer that triggers the processing logic at block 202 or the event limit threshold that triggers the processing logic at block 204. In some implementations, determining whether to update the background scan frequencies can include comparing values from a CDF-based data to one or more corresponding thresholds, as further described in relation to FIG. 4A. In some implementations, determining whether to update the background scan frequencies can include comparing values based on the event data from one or more corrective actions to one or more corresponding thresholds, as further described in relation to FIG. 4B. In some implementations, determining whether to update the background scan frequencies can include comparing values based on error recovery depth statistics to one or more corresponding thresholds, as further described in relation to FIG. 4C.

In some implementations, a user can make manual adjustments to background scan frequencies and control other aspects of a memory system using vendor specific (VS) commands. VS commands can also be used to retrieve various aspects of the gathered background scanning result or event data.

Figure 3:
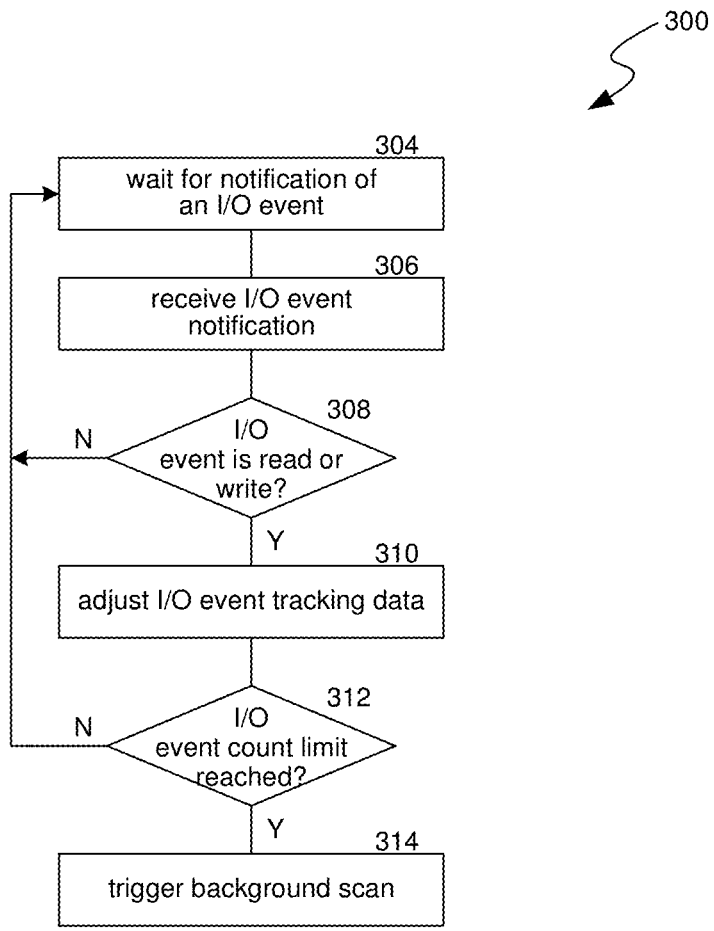
FIG. 3 is a flow diagram of an example method to trigger background scans based on an event limit in accordance with some embodiments of the present disclosure.

FIG. 3 is a flow diagram of an example method 300 to trigger background scans based on an event limit in accordance with some implementations of the present technology. Method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 300 is performed by the dynamic background scanner 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 304, the processing logic for method 300 can wait for a notification that an I/O operation is being performed. When the I/O operation is performed, the I/O notification is received at block 306.

At block 308, the processing logic determines whether the I/O notification indicates A) a read or write operation or B) some other I/O operation. When a read or write operation is indicated, the processing logic continues to block 310. Otherwise, the processing logic returns to block 304 to wait for the next I/O notification.

At block 310, the processing logic can adjust event tracking data (e.g. incrementing an I/O event counter). This can be the tracking data that is reset at block 216 (or 202/204 in some implementations). At block 312, the event tracking data is compared to an I/O event count limit threshold. If the event tracking data is less than the I/O event count limit threshold, the processing logic can return to block 304 to wait for the next I/O event notification. If the event tracking data has reached the I/O event count limit threshold, the processing logic can continue to block 314 where it triggers a background scan, e.g. at block 204.

Figure 4A:
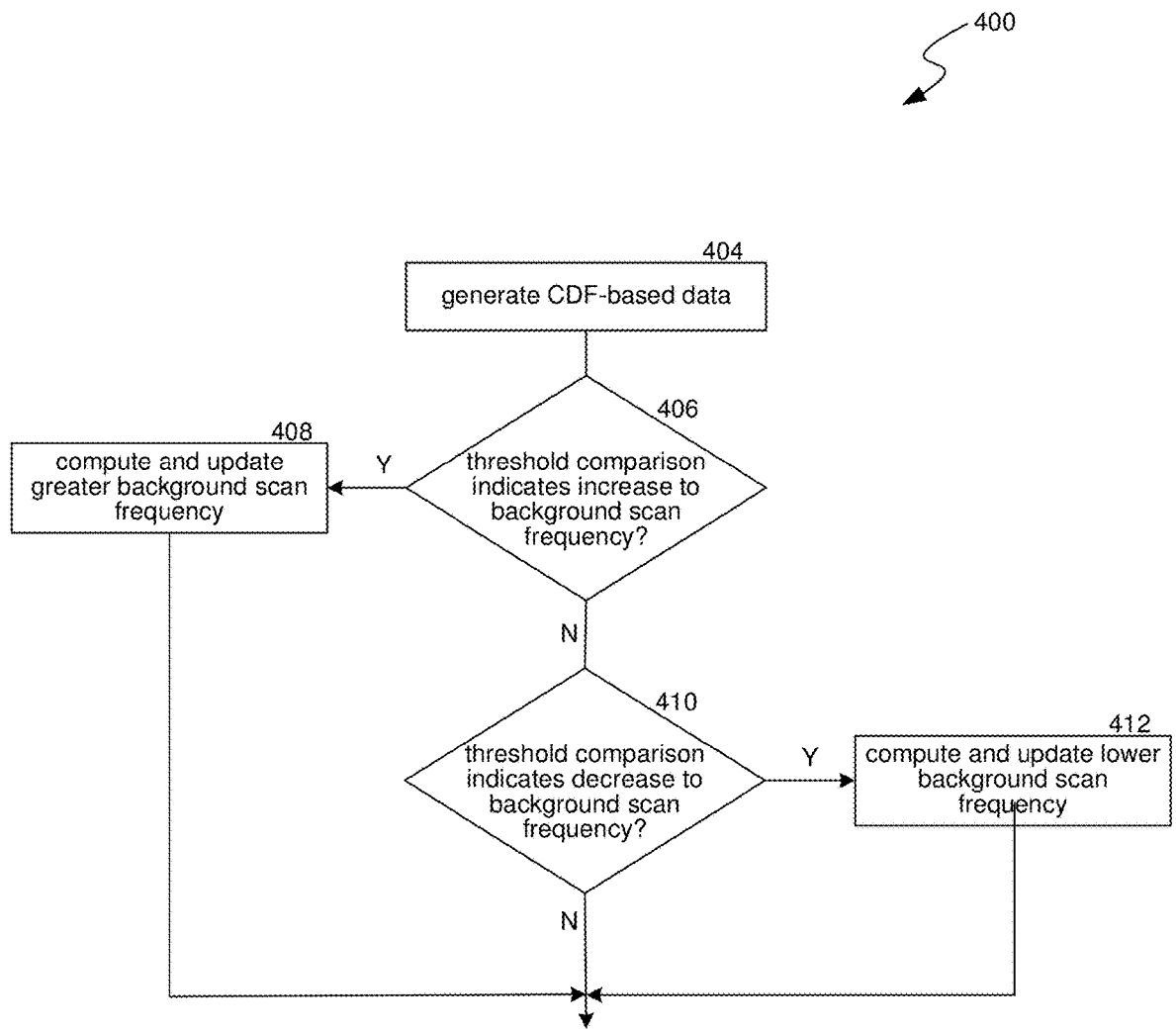
FIG. 4A is a flow diagram of an example method to update background scan frequency based on error histogram data in accordance with some embodiments of the present disclosure.

FIG. 4A is a flow diagram of an example method 400 to update background scan frequency based on error histogram data in accordance with some implementations of the present technology. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the dynamic background scanner 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 404, the processing logic for method 400 can generate CDF-based data using histogram data generated from multiple background scans. The histogram data can be error counts (e.g. bits in error) per memory unit (e.g. codeword) during I/O operations, where the independent variable is a number of errors or other quality measure and the dependent variable is the number of memory units that have that number of errors. Other error counts can also be used. For example, error counts can be for any memory size, and memory units or sizes can be of any amount such as blocks, pages, regions, whole devices, multiple devices, etc. In some implementations, the histogram data can be the scan result data saved at block 208. In other implementations, the histogram data can be obtained during other memory system processes, such error counts from standard read and write operations, during testing of the memory system, etc. In various implementations, the histogram data can be data collected from the same memory system for which the processing logic is updating background scan frequency or from other memory systems.

The processing logic can convert the histogram data into cumulative distribution function (CDF)-based data. CDF-based data is data that incorporates the CDF function of a set of data, where the CDF is the function whose dependent value is the probability that a corresponding continuous random variable has a value less than or equal to a given independent value. For example, in terms of error measures of codewords in memory, the CDF-based data can specify, for a given amount of errors, the frequency of codewords that are expected have no more than that amount of errors. Examples of CDF-based data are provided in FIGS. 5A and 5B. The CDF-based data can be generated as one minus the CDF of the histogram, on a logarithmic scale. In some implementations, this conversion of histogram data to CDF-based data can include converting each of multiple histograms into CDF-based data (e.g. CDF-based data 508A-508N and 558A-558N) and combining the CDF-based data (e.g. through summation) from each histogram into combined CDF-based data (e.g. CDF-based data 502 and 552). In some implications, the conversion can include combining (e.g. averaging) each of multiple histograms into a combined histogram and converting the combined histogram into the combined CDF-based data.

Figure 5A:
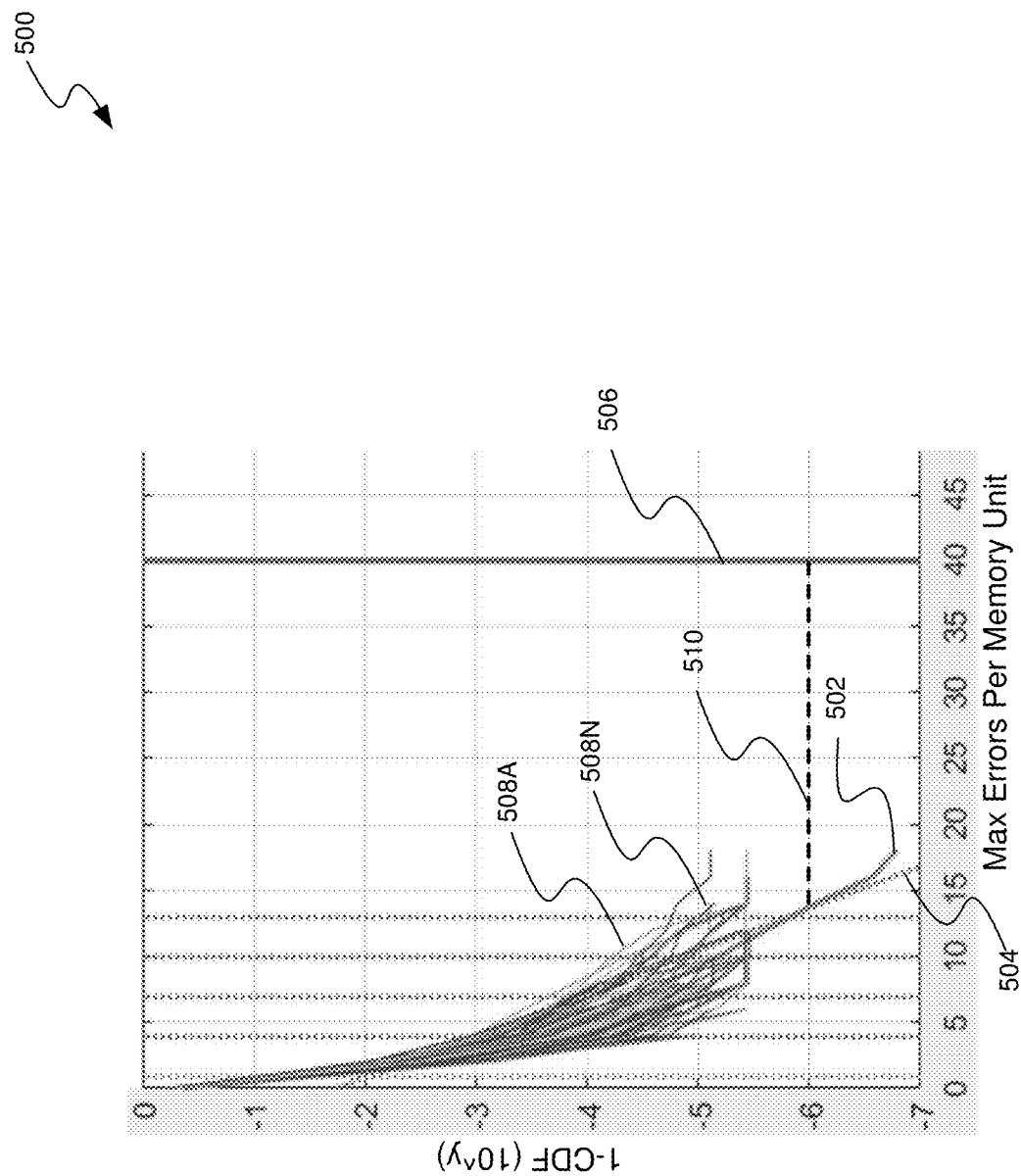
FIGS. 5A and 5B are conceptual diagrams of example CDF-based data.
Figure 5B:
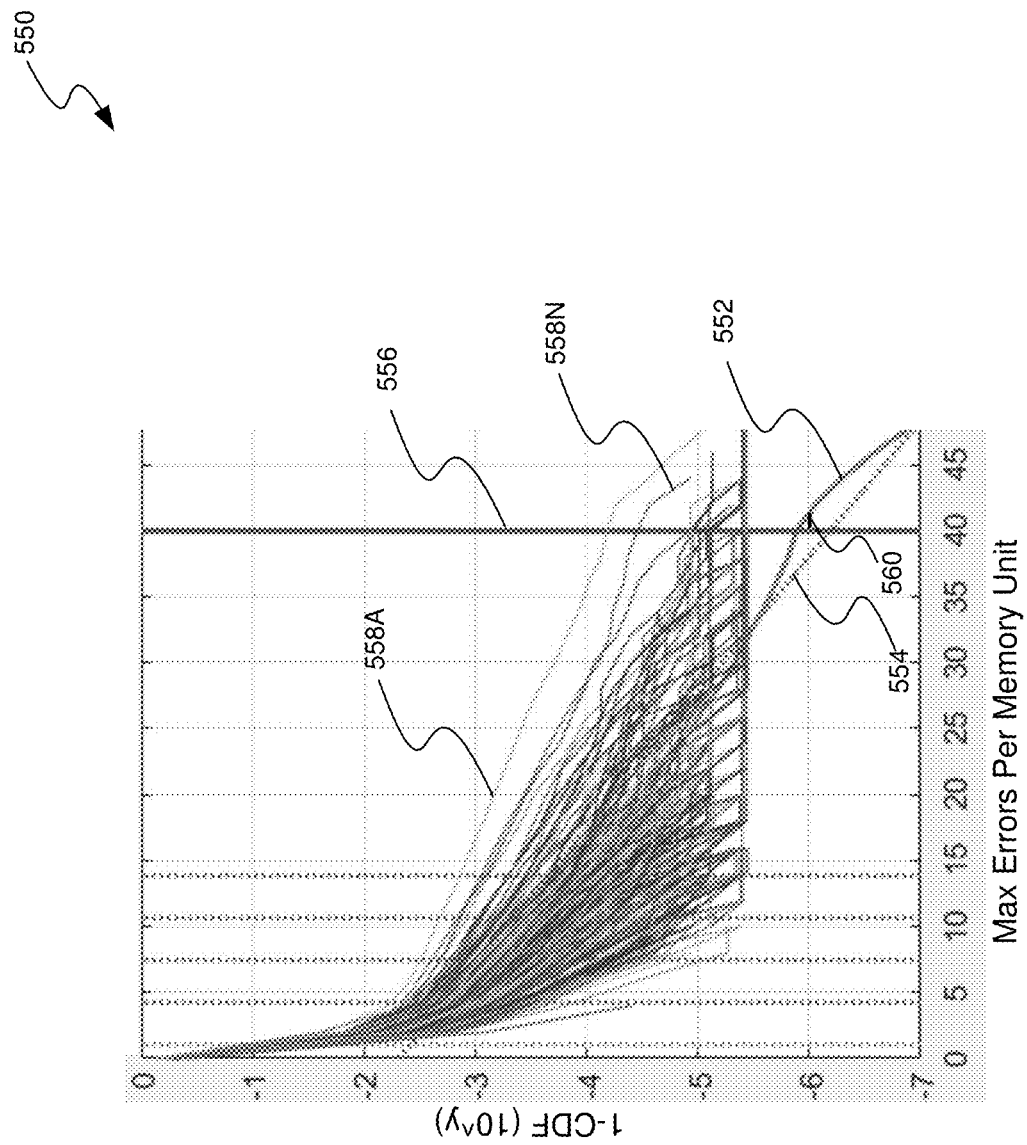

At block 406, the processing logic can compare a metric based on values from the CDF-based data generated at block 404 to a background scan increase threshold. In some implementations, the value from the CDF-based data can be the x-axis value where the CDF-based data intersects with a given horizontal y-axis line. For example, an intersection of the CDF-based data with the line at the y-axis value of $10^{-6}$ could be 35, indicating that the probability of having at least 35 errors in a memory unit is one in $10^{6}$. The metric can be a difference between the value from the CDF-based data and a background scan limit (e.g. background scan limits 506 and 556). In some implementations, the metric can be a point at which the CDF-based data intersects with the background scan limit. In FIG. 5A, the difference is margin 510 and has a value of −27. In FIG. 5B the difference is margin 560 and has a value of 2. In the FIGS. 5A and 5B examples, margins below the background scan limits 506 and 556 are computed as negative and margins above the background scan limits 506 and 556 are computed as positive, however other implementations can use the difference magnitude with alterations to how the threshold comparisons are performed.

In some cases, the CDF-based data may not intersect with the background scan limit y-axis line (as is the case in FIG. 5A), the CDF-based data may not intersect with the background scan limit, or a smoother function can be preferred to the actual CDF-based data (as is the case in FIG. 5B). To determine the metric in these cases, the processing logic can fit a function, such as a line or a function of another degree (e.g. lines 504 and 554) to the existing CDF-based data. The processing logic can then extrapolate, using the function, an expected intersection point with either the y-axis value or background scan limit, depending on the implementation.

If, at block 406, the metric is above a background scan increase threshold, this can indicate the scanned portion of memory would benefit from a greater background scan frequency. This is the case in the example in FIG. 5B where the example background scan increase threshold is −10, indicating the background scan frequency should be increased when the CDF-based data indicates a probability of greater than $1/10^{6}$ of a codeword having at least 30 bit errors (where 30 is the background limit 40 plus the −10 increase threshold). Because the margin in FIG. 5B is 2, which is greater than −10, the background scan frequency in this example will be increased. A similar analysis can be performed for implementations that use an intersection point between the CDF-based data and the background scan limit as the metric by determining whether this intersection point exceeds a background scan increase threshold specified on the background scan limit line. Where the metric exceeds a background scan increase threshold at block 406, the processing logic continues to block 408. Otherwise, the processing logic continues to block 410.

At block 408, the processing logic computes an amount to increase the background scan frequency and updates the memory system to perform background scans at the increased frequency. In some implementations, the background scan frequency will be increased by a set amount at block 408. In other implementations, an amount to change the background scan frequency can be determined based on the magnitude of a difference between the metric and the increase threshold, determined at block 406. In the FIG. 5B example, this magnitude is 12 (e.g. abs(−10−2)). A function can take the magnitude as a parameter and specify an amount to decrease the background scan timer or the background scan I/O event limit. In some implementations, this function can be based on a statistical analysis of changes to memory system reliability and performance at different background scan frequencies. The function can be configured to increase the background scan frequency such that, when a new metric is computed by the process at block 406, it will decrease the metric's magnitude. For example, this function can be a linear, logarithmic, or other degree relationship that maps magnitude values to increases in background scan frequency. As another example, this function can be generated by training a machine learning model to select background scan frequencies expected to improve the metric (e.g. decrease the magnitude). In various implementations, updating the memory system to perform the background scans at the increased frequency can include adjusting the timer used to initiate the processing logic at block 202, updating the I/O event limit used to initiate the processing logic at block 204, or both.

If, at block 410, the metric is below a background scan decrease threshold, this can indicate that performing background scans less frequently is unlikely to produce an unacceptable number of errors. This is the case in the example in FIG. 5A where the background scan decrease threshold is −20, indicating the background scan frequency should be decreased when the CDF-based data indicates a probability of less than $1/10^{6}$ of a codeword having at least 20 bit errors (where 20 is the background limit 40 plus the −20 increase threshold). Because the margin in FIG. 5A is −27, which is less than −20, the background scan frequency in this example will be decreased. A similar analysis can be performed for implementations that use an intersection point between the CDF-based data and the background scan limit as the metric by determining whether this intersection point is below a background scan decrease threshold specified on the background scan limit line. Thus, where the metric is below a background scan decrease threshold at block 410, the processing logic continues to block 412. Otherwise, the processing logic skips block 412, indicating no background scan updates are to be performed.

At block 412, the processing logic computes an amount to decrease the background scan frequency and updates the memory system to perform background scans at the decreased frequency. In some implementations, the background scan frequency will be decreased by a set amount at block 412. In other implementations, the amount to change the background scan frequency can be determined based on the magnitude of a difference between the metric and the decrease threshold, determined at block 410. In the FIG. 5A example, this magnitude is 7 (e.g. abs(−20−−27)). A function can take the magnitude as a parameter and specify an amount to increase the background scan timer or the background scan I/O event limit. In some implementations, this function can be based on a statistical analysis of changes to memory system reliability and performance at different background scan frequencies. The function can be configured to decrease the background scan frequency such that, when a new metric is computed by the process at block 410, it will decrease the magnitude. For example, this function can be a linear, logarithmic, or other degree relationship that maps magnitude values to decreases in background scan frequency. As another example, this function can be generated by training a machine learning model to select background scan frequencies expected to improve the metric (e.g. decrease the magnitude). In various implementations, updating the memory system to perform the background scans at the decreased frequency can include adjusting the timer used to initiate the processing logic at block 202, updating the I/O event limit used to initiate the processing logic at block 204, or both.

Figure 4B:
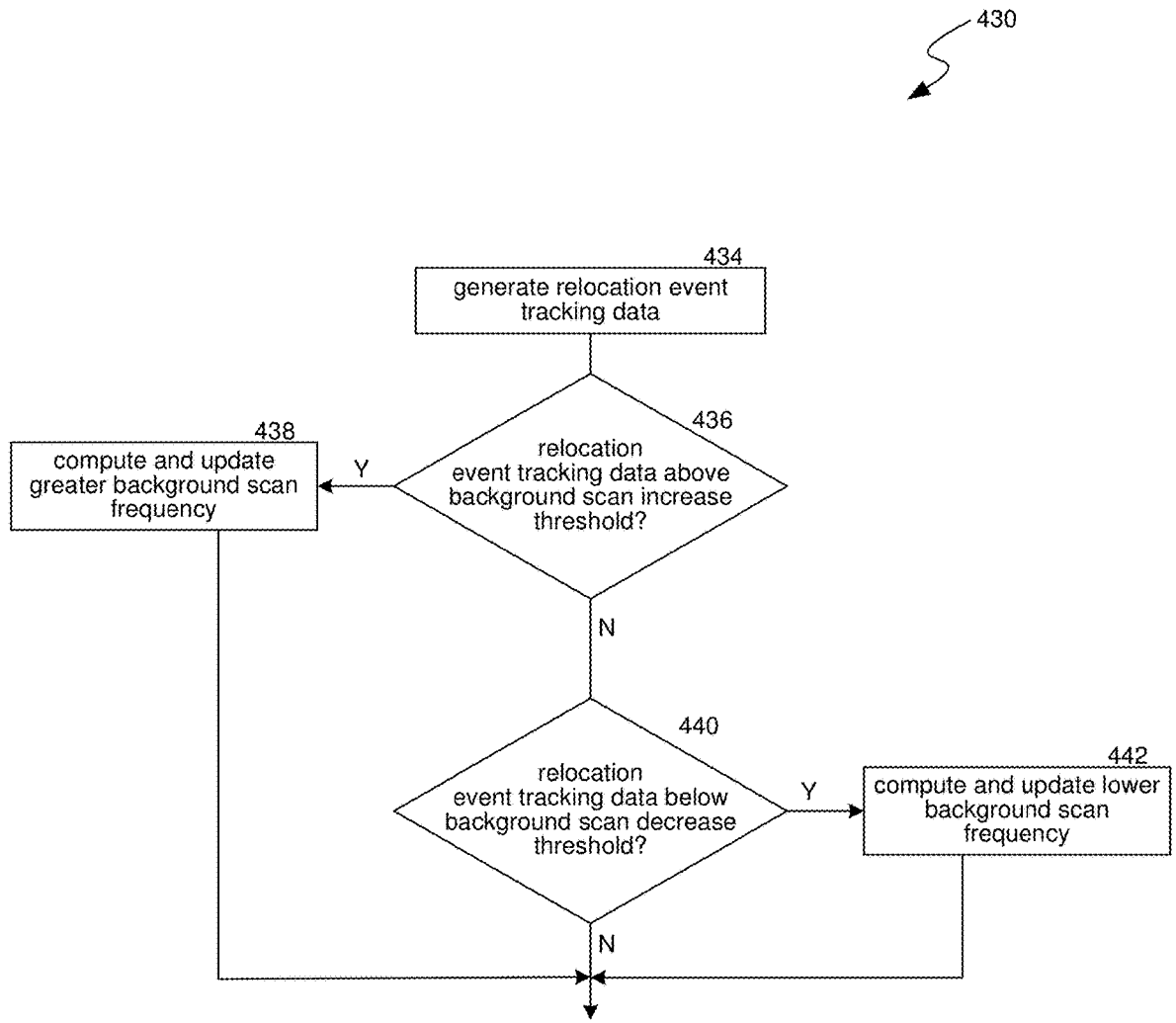
FIG. 4B is a flow diagram of an example method to update background scan frequency based on relocation event statistics in accordance with some embodiments of the present disclosure.

FIG. 4B is a flow diagram of an example method 430 to update background scan frequency based on relocation event tracking data in accordance with some implementations of the present technology. The method 430 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 430 is performed by the dynamic background scanner 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 434, the processing logic for method 430 can generate relocation event tracking data. In various implementations, the relocation event tracking data can be based on the event data saved at block 214 resulting from background scans, event data from relocation events generated through standard I/O operations, or event data from other testing procedures such as manufacturer tests suites. In various implementations, the relocation event tracking data can be an overall count of relocation events, a count of relocation events that took place within a given time window, or a frequency of relocation events (e.g. a percentage of read operations that resulted in a relocation event or a percentage of the read memory units that resulted in a relocation event).

In three different example memory systems, data saved at block 202 corresponding to each memory system can be used to generate relocation event tracking data for a three week time window. For the first example memory system, the relocation event tracking data can indicate that 15 relocation events were recorded in the time window. For the second example memory system, the relocation event tracking data can indicate that three relocation events were recorded in the time window. For the third example memory system, the relocation event tracking data can indicate that zero relocation events were recorded in the time window.

At block 436, the processing logic can compare the relocation event tracking data generated at block 434 to a background scan increase threshold. If, at block 436, the relocation event tracking data exceeds the background scan increase threshold, this can indicate the scanned portion of memory would benefit from a greater background scan frequency, e.g. by producing less relocation events. If the relation event tracking data is above the background scan increase threshold, the processing logic can continue to block 438. Otherwise, the processing logic can continue to block 440.

Returning to the above three examples, the background scan increase threshold is set at six relocation events for a three week period. Thus, the processing logic performed for the first memory system with 15 relocation events in the three week period will proceed to block 438 and the methods 430 performed for the second and third memory systems with three and zero relocation events respectively in the three week period will proceed to block 440.

At block 438, the processing logic computes an amount to increase the background scan frequency and updates the memory system to perform background scans at the increased frequency. In various implementations, the amount to increase the background scan frequency can be a predetermined amount or can be an amount based on the relocation event tracking data generated at block 434. Where the amount of increase to the background scan frequency is variable, it can be determined using a function that takes the relocation event tracking data as a parameter and specifies an amount to decrease the background scan timer or the background scan I/O event limit. In some implementations, this function can be based on a statistical analysis of changes to memory system reliability and performance at different background scan frequencies. For example, this function can be a linear, logarithmic, or other degree relationship that maps a relocation event statistic to an increase in background scan frequency. As another example, this function can be generated by training a machine learning model to select background scan frequencies expected to reduce relocation events by an amount below the background scan increase threshold but keeping it above a background scan decrease threshold. In various implementations, updating the memory system to perform the background scans at the increased frequency can include adjusting the timer used to initiate the processing logic at block 202, updating the I/O event limit used to initiate the processing logic at block 204, or both.

Returning to the above first example, at block 438 the mapping function can take the relocation event tracking data value of 15 events and return an indication that the background scan frequencies should be increased by cutting the timer down by one-third and decreasing the I/O event limit to 1200 read or write events.

If, at block 440, the relocation event tracking data is below a background scan decrease threshold, this can indicate performing background scans less frequently is unlikely to produce an unacceptable number of relocation events. If the relation event tracking data is below the background scan decrease threshold, the processing logic can continue to block 442. Otherwise, the processing logic can skip block 442.

Returning to the above second and third examples, the background scan increase threshold is set at two relocation events for a three week period. Thus, the processing logic performed for the second memory system with three relocation events in the three week period will proceed to block 442. Conversely, the methods 430 performed for the third memory systems with zero relocation events in the three week period will skip block 442, indicating no background scan updates are to be performed.

At block 442, the processing logic computes an amount to decrease the background scan frequency and updates the memory system to perform background scans at the decreased frequency. In various implementations, the amount to decrease the background scan frequency can be a predetermined amount or can be an amount based on the relocation event tracking data generated at block 434. Where the amount of decrease to the background scan frequency is variable, it can be determined using a function that takes the relocation event tracking data as a parameter and specifies an amount to increase the background scan timer or the background scan I/O event limit. In some implementations, this function can be based on a statistical analysis of changes to memory system reliability and performance at different background scan frequencies. For example, this function can be linear, logarithmic, or another degree specifying a relationship that maps relocation event tracking data to decreases in background scan frequency. As another example, this function can be generated by training a machine learning model to select background scan frequencies expected to increase memory performance (with a corresponding increase in the relocation event tracking data above the background scan decrease threshold) while keeping the relocation event tracking data below the background scan increase threshold. In various implementations, updating the memory system to perform the background scans at the decreased frequency can include adjusting the timer used to initiate the processing logic at block 202, updating the I/O event limit used to initiate the processing logic at block 204, or both.

Returning to the third above example, at block 442 the mapping function can take the relocation event tracking data of zero and return an indication that the background scan frequencies should be decreased by increasing the timer to 250 seconds.

Figure 4C:
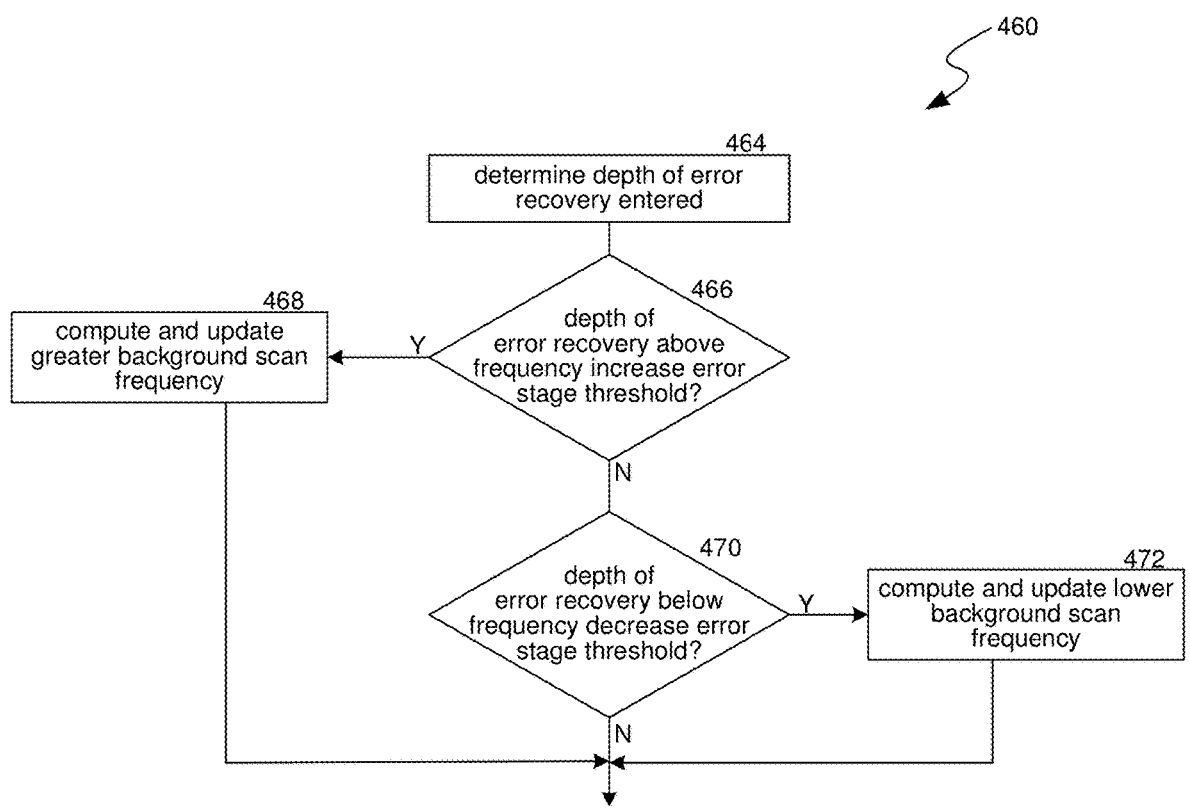
FIG. 4C is a flow diagram of an example method to update background scan frequency based on error recover stage depth in accordance with some embodiments of the present disclosure.

FIG. 4C is a flow diagram of an example method 460 to update background scan frequency based on error recover depth in accordance with some implementations of the present technology. The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the dynamic background scanner 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 464, the processing logic for method 460 can determine a depth of error recovery reached. In various implementations, the error depth determination can be based on the scan result data saved at block 208 resulting from background scans, from error events that occurred during standard I/O operations, or error events from other testing procedures such as manufacturer tests suites. When an error event occurs, various corrective measures can be performed to correct the error. In some implementations, the corrective measures are arranged in a flow where, when an error occurs, successive recovery procedures of the flow are performed until one of the procedures handles the error. In various implementations, the flow includes up to 17 error recovery procedures, each referred to herein as an error recovery step (ERS; e.g. ERS1-ERS17). In some implementations, a flow with 15 ERSs is divided into zones, such as zone1 (ERS1-ERS8) where recovery is considered in calibration and no block management is performed; zone2 (ERS9-ERS12) where recovery is considered out of calibration and minimal block management is performed; and zone3 (ERS14-ERS15) where recovery is considered far out of calibration and active block management is performed. In some implementations, ERSs or zones have corresponding numerical values, e.g. 0-15 or 0-3, with 0 indicating an operation without an error so no recovery was needed. In various implementations, the depth of error recovery, determined at block 464, can be based on one or more error events and can be an indication of: a maximum error ERS or zone reached in the flow, an average of the numerical values of ERSs or zones reached, a rate at which at least the first ERS of the flow was triggered, a count of memory portions (e.g. die) for which each ERS was reached, etc. Example error recover depth data is provided in FIGS. 6A and 6B. In FIG. 6A, ERS stage data 600 illustrates test results for four die (CE0-CE3), where 238 read operations were performed on each die and the count of each ERS reached for each read operations was logged. In FIG. 6B, ERS stage data 650 illustrates test results for four die (CE4-CE7), where 229 read operations were performed on each die and the count of each ERS reached for each read operations was logged.

At block 466, the processing logic can compare the depth of error recovery determined at block 464 to a background scan increase threshold. If, at block 466, the depth of error recovery is above the background scan increase threshold, this can indicate the portion of memory causing the errors resulting in the determined depth of error recovery would benefit from a greater background scan frequency, e.g. by producing errors or more easily correctable errors. If the depth of error recovery is above the background scan increase threshold, the processing logic can continue to block 468. Otherwise, the processing logic can continue to block 470.

In the examples in FIGS. 6A and 6B, the background scan increase threshold is an error recovery depth indicating that five or more read operations across the four die experienced greater than 1% or read operations entering at least ERS5. In FIG. 6A, there was only one read operation out of 952 (0.1%) that entered at least ERS5. Thus, the processing logic corresponding to FIG. 6A would proceed to block 470. In FIG. 6B, there were 23 read operation out of 916 (2.5%) that entered at least ERS5. Thus, the processing logic corresponding to FIG. 6B would proceed to block 468.

At block 468, the processing logic computes an amount to increase the background scan frequency and updates the memory system to perform background scans at the increased frequency. In various implementations, the amount to increase the background scan frequency can be a predetermined amount or can be an amount based on the depth of error recovery determined at block 464. Where the amount of increase to the background scan frequency is variable, it can be determined using a function that takes the depth of error recovery as a parameter and specifies an amount to decrease the background scan timer or the background scan I/O event limit. In some implementations, this function can be based on a statistical analysis of changes to memory system reliability and performance at different background scan frequencies. For example, this function can be a linear, logarithmic, or other degree relationship that maps a depth of error recovery to an increase in background scan frequency. As another example, this function can be generated by training a machine learning model to select background scan frequencies expected to reduce errors or the severity of errors by an amount below the background scan increase threshold but keeping it above a background scan decrease threshold. In various implementations, updating the memory system to perform the background scans at the increased frequency can include adjusting the timer used to initiate the processing logic at block 202, updating the I/O event limit used to initiate the processing logic at block 204, or both.

If, at block 470, the depth of error recovery is below a background scan decrease threshold, this can indicate performing background scans less frequently is unlikely to produce an unacceptable number of errors or to unacceptably increase error severity. If the depth of error recovery is below the background scan decrease threshold, the processing logic can continue to block 472. Otherwise, the processing logic can skip block 472.

In the example in FIG. 6A, the background scan decrease threshold is an error recovery depth indicating that at least 75% of read operations did not have an error (ERS0) and that no errors resulted in more than a zone1 error recovery (e.g. no ERS entered was greater than ERS8). In FIG. 6A, there were 771 out of 952 (81%) read operations did not have an error and only zone1 ERSs were entered (ERS5 was the highest ERS). Thus, the processing logic corresponding to FIG. 6A would proceed to block 472.

At block 472, the processing logic computes an amount to decrease the background scan frequency and updates the memory system to perform background scans at the decreased frequency. In various implementations, the amount to decrease the background scan frequency can be a predetermined amount or can be an amount based on the depth of error recovery determined at block 464. Where the amount of decrease to the background scan frequency is variable, it can be determined using a function that takes the depth of error recovery as a parameter and specifies an amount to increase the background scan timer or the background scan I/O event limit. In some implementations, this function can be based on a statistical analysis of changes to memory system reliability and performance at different background scan frequencies. For example, this function can be a linear, logarithmic, or other degree relationship that maps a depth of error recovery to a decrease in background scan frequency. As another example, this function can be generated by training a machine learning model to select background scan frequencies expected to increase memory performance (with a corresponding increase in depth of error recovery by an amount above the background scan decrease threshold) while keeping the depth of error recovery below the background scan increase threshold. In various implementations, updating the memory system to perform the background scans at the decreased frequency can include adjusting the timer used to initiate the processing logic at block 202, updating the I/O event limit used to initiate the processing logic at block 204, or both.

Figure 7:
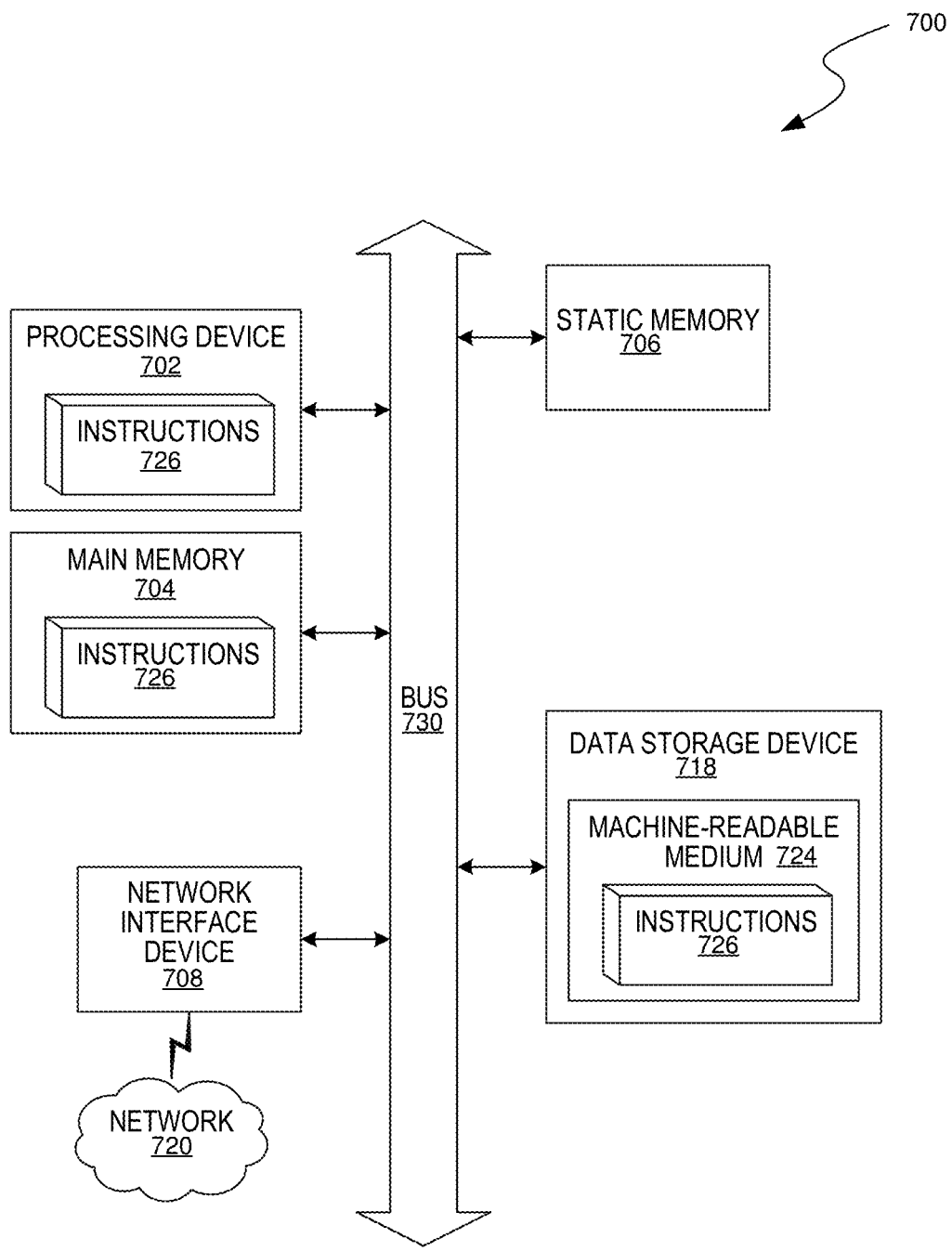
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the dynamic background scanner 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a dynamic background scanning component that can trigger background scans based on either a timer or event counter and can automatically adjust background frequency based on CDF-based data, relocation event tracking data, or error recovery depth (e.g., the dynamic background scanner 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-7 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. A method comprising:
    initiating a background scan in relation to a memory portion, wherein the background scan includes reading the memory portion and, based on an amount or type of corrections needed in relation to the memory portion, produces background scan results comprising cumulative distribution function (CDF)-based data indicating a probability of a unit of memory of the memory portion having at least a specified number of errors;
    determining that a metric based on the background scan results exceeds a background scan limit;
        in response to the determining that the metric exceeds the background scan limit, scheduling a refresh relocation in relation to the memory portion, wherein the refresh relocation comprises reading all stored data from the memory portion and writing all the stored data back to the memory portion or to a different memory portion;
    comparing refresh relocation tracking data to one or more background scan thresholds; and
    adjusting a background scan frequency based on at least one of the comparisons of the refresh relocation tracking data to the one or more background scan thresholds.

2. The method of claim 1, further comprising identifying a background scan trigger event from a set of background scan trigger events, wherein the set of background scan trigger events comprises reaching a timing threshold and reaching an I/O event limit.

3. The method of claim 2, wherein identifying the background scan trigger event comprises:
    receiving a notification of an I/O event;
    determining that the I/O event is a read event or a write event; and
    in response to the determining that the I/O event is the read event or the write event, determining that event tracking data reaches an event count limit.

4. The method of claim 1, wherein the refresh relocation tracking data comprises a counter counting a number of relocation events within a specified time period.

5. The method of claim 1, wherein the comparing the refresh relocation tracking data to one or more background scan thresholds comprises:
    determining that the refresh relocation tracking data exceeds a background scan increase threshold; and
    in response to the determining that the refresh relocation tracking data exceeds the background scan increase threshold, determining a new background scan frequency, wherein the new background scan frequency is greater than a current background scan frequency;
    wherein the adjusting the background scan frequency comprises setting the background scan frequency to the new background scan frequency.

6. The method of claim 5, wherein the new background scan frequency is computed as a function of the refresh relocation tracking data.

7. A non-transitory computer-readable storage medium comprising instructions that, when executed by one or more processing devices, cause the one or more processing devices to:
    perform a background scan in relation to a memory portion, wherein the background scan produces cumulative distribution function (CDF)-based data specifying a probability of a unit of memory having at least a specified number of errors;
    combine the CDF-based data with CDF-based data produced from other background scans to generate combined CDF-based data;
    compare the combined CDF-based data to one or more background scan thresholds; and
    adjust a background scan frequency based on at least one of the comparisons of the combined CDF-based data to the one or more background scan thresholds.

8. The computer-readable storage medium of claim 7, wherein performing the background scan comprises performing a read operation on the memory portion; and
    wherein the read operation produces a value indicating a condition of the memory portion which is incorporated in a histogram used to create the CDF-based data.

9. The computer-readable storage medium of claim 7, wherein executing the instructions further causes the one or more processing devices to identify a background scan trigger event from a set of background scan trigger events; and
    wherein the set of background scan trigger events comprises reaching a timing threshold and reaching an I/O event limit.

10. The computer-readable storage medium of claim 9, wherein identifying the background scan trigger event comprises:
    receiving a notification of an I/O event;
    determining that the I/O event is a read event or a write event; and
    in response to the determining that the I/O event is the read event or the write event, determining that event tracking data exceeds an event count limit.

11. The computer-readable storage medium of claim 7, wherein the CDF-based data is created from one or more histograms of error events.

12. The computer-readable storage medium of claim 7, wherein the comparing the CDF-based data to the one or more background scan thresholds comprises:
   determining a value of the CDF-based data at a specified point on the Y-axis; and
   computing a difference between the determined value of the CDF-based data and a background scan limit.

13. The computer-readable storage medium of claim 7, wherein the comparing the CDF-based data to the one or more background scan thresholds comprises identifying where, on the Y-axis, the CDF-based data intersects with a background scan limit.

14. The computer-readable storage medium of claim 7, wherein the comparing the CDF-based data to the one or more background scan thresholds comprises:
   fitting the CDF-based data to a function; and
   computing a projection of the CDF-based data using the function.

15. A system comprising:
   a memory component; and
   one or more processors that perform operations comprising:
      determining error stage statistics for depths of error recovery reached, in a recovery processes comprising multiple error recovery stages, during one or more of:
         background scans;
         standard I/O operations;
         manufacturer tests; or
         any combination thereof;
      comparing the error stage statistics to one or more background scan thresholds; and
      adjusting a background scan frequency based on one of the comparisons.

16. The system of claim 15, wherein the error stage statistics are determined from at least the standard I/O operations, wherein at least some of the standard I/O operations comprise performing a read operation on a memory portion, wherein the read operation produces a value indicating a condition of the memory portion.

17. The system of claim 15, wherein adjusting the background scan frequency comprises changing a threshold for identifying a background scan trigger event, wherein the threshold for identifying the background scan trigger event comprises either:
   a timing threshold, wherein the background scan trigger event occurs when a timer ends based on the timing threshold; or
   an I/O event limit, wherein the background scan trigger event occurs when event tracking data reaches a threshold based on the I/O event limit.

18. The system of claim 17, wherein identifying the background scan trigger event comprises:
   receiving a notification of an I/O event;
   determining that the I/O event is a read event or a write event;
   in response to the determining that the I/O event is the read event or the write event, adjusting event tracking data; and
   determining that the adjusted event tracking data reached an event count limit.

19. The system of claim 15, wherein error stage statistics comprises an average of numerical values corresponding to the error stages reached when performing a set of I/O operations.

* * * * *